(12) United States Patent
Chen et al.

(10) Patent No.: US 8,164,004 B2
(45) Date of Patent: Apr. 24, 2012

(54) EMBEDDED CIRCUIT STRUCTURE AND FABRICATING PROCESS OF THE SAME

(75) Inventors: Tsung-Yuan Chen, Taoyuan County (TW); Shu-Sheng Chiang, Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 1161 days.

(21) Appl. No.: 11/958,920

(22) Filed: Dec. 18, 2007

(65) Prior Publication Data

US 2009/0008145 A1  Jan. 8, 2009

(30) Foreign Application Priority Data

Jul. 6, 2007  (TW) ................................ 96124679 A

(51) Int. Cl.
  *H05K 1/11*  (2006.01)

(52) U.S. Cl. ....................................... 174/262; 174/266

(58) Field of Classification Search .......... 174/262–266; 361/792–795

See application file for complete search history.

(56) References Cited

U.S. PATENT DOCUMENTS

| | | | |
|---|---|---|---|
| 5,504,992 A | | 4/1996 | Fukutomi et al. |
| 6,004,619 A | * | 12/1999 | Dippon et al. ................... 29/852 |
| 2006/0191710 A1 | * | 8/2006 | Fushie et al. ................... 174/258 |
| 2008/0000678 A1 | * | 1/2008 | Johnston et al. ............... 174/262 |

* cited by examiner

*Primary Examiner* — Jeremy Norris
(74) *Attorney, Agent, or Firm* — J.C. Patents

(57) ABSTRACT

A fabricating process for an embedded circuit structure is provided. A through hole is formed in a core panel and penetrates the core panel. Two indent patterns are respectively formed on two opposite surfaces of the core panel. A conductive material is electroplated into the through hole and the indent patterns, so as to form a conductive channel in the through hole and two circuit patterns in the indent patterns respectively. Portions of the circuit patterns, which exceed the indent patterns respectively, are removed for planarizing the circuit patterns to be level with the two surfaces of the core panel respectively.

1 Claim, 8 Drawing Sheets

EMBEDDED CIRCUIT STRUCTURE AND FABRICATING PROCESS OF THE SAME

CROSS-REFERENCE TO RELATED APPLICATION

This application claims the priority benefit of Taiwan application serial no. 96124679, filed on Jul. 6, 2007. The entirety of the above-mentioned patent application is hereby incorporated by reference herein and made a part of this specification.

BACKGROUND OF THE INVENTION

1. Field of the Invention

The present invention relates to a circuit structure and a fabricating process thereof, and more particularly, to an embedded circuit structure and a fabricating process thereof.

2. Description of Related Art

As the contact number and the contact density of an integrated circuit chip increase, the contact number and the contact density of a circuit substrate for packaging chips have to increase correspondingly. In addition to the circuit substrate for packaging the chips, along with the miniaturized and thinner electronic products, the development of the circuit substrate used on a mother board of the electronic products advances gradually toward a trend of high layout density. Therefore, the requirement of the circuit substrate with high layout density continuously increases.

Currently, a fabricating process for the circuit substrate substantially includes a laminating process and a build-up process.

The laminating process includes that required patterned circuit layers and dielectric layers are laminated into a laminated structure after the patterned circuit layers on surfaces of the dielectric layers have been completely fabricated; then, a plated through hole (PTH) process is performed for connecting the patterned circuit layers in two different levels. The build-up process includes that the patterned circuit layers are formed on a substrate sequentially, and a conductive via connected with a preceding patterned circuit layer is fabricated in the process of sequentially fabricating another patterned circuit layer next to the preceding one.

U.S. Pat. No. 5,504,992 discloses a fabricating process for a circuit board. The fabricating process includes that a photoresist pattern is formed on a thin metallic layer at one side of a thin metallic panel; next, the thin metallic layer is used as an electroplating seed layer to form a circuit pattern on portions of the thin metallic layer, which are not covered by the photoresist pattern; then, the photoresist pattern is removed. Thereafter, the aforesaid two circuit patterns are embedded into two surfaces of a same dielectric layer respectively for forming a laminated structure, and a conductive material is electroplated to an inner wall of a through hole for forming a conductive channel to connect the aforesaid two circuit patterns after the through hole is formed in the laminated structure. Finally, the thin metallic panels and the thin metallic layers are removed, and the dielectric layer, the circuit patterns embedded into the two surfaces of the dielectric layer, and the conductive channel which connects the circuit patterns remain. It should be noted that in U.S. Pat. No. 5,504,992, the thin metallic layer which serves as the electroplating seed layer is removed and does not remain between the circuit patterns and the dielectric layer after the fabricating process is completed.

SUMMARY OF THE INVENTION

The present invention is directed to a fabricating process for an embedded circuit structure in order to increase the alignment accuracy between embedded circuit patterns relatively.

The present invention is further directed to an embedded circuit structure, which can increase the alignment accuracy between the embedded circuit patterns relatively in a fabricating process thereof.

The present invention provides a fabricating process for an embedded circuit structure. A core panel is provided. At least one through hole is formed in a core panel and penetrates the core panel. A first indent pattern is formed on a first surface of the core panel. A second indent pattern is formed on a second surface of the core panel. The second surface of the core panel is opposite to the first surface of the core panel. A conductive material is electroplated into the through hole, the first indent pattern and the second indent pattern, so as to form a conductive channel in the through hole, a first circuit pattern in the first indent pattern and a second circuit pattern in the second indent pattern, wherein portions of the first circuit pattern exceed the first indent pattern, portions of the second circuit pattern exceed the second indent pattern, and the electroplating process includes performing a chemical electroplating process at first and then performing an electrolysis electroplating process. The portions of the first circuit pattern, which exceed the first indent pattern, are removed for planarizing the first circuit pattern to be level with the first surface of the core panel; the portions of the second circuit pattern, which exceed the second indent pattern, are removed for planarizing the second circuit pattern to be level with the second surface of the core panel.

In one embodiment of the present invention, the step of forming the through hole may include a mechanical processing or a laser processing.

In one embodiment of the present invention, the step of forming the first indent pattern and the second indent pattern may include a laser processing.

In one embodiment of the present invention, the step of removing the portions of the first circuit pattern and the portions of the second circuit pattern may include etching or polishing.

In one embodiment of the present invention, the conductive channel may have a tubular space.

In one embodiment of the present invention, the fabricating process may further include that a stuffing material is filled into the tubular space of the conductive channel.

In one embodiment of the present invention, the fabricating process may further include that portions of a stuffing pillar, which protrude from the first surface and the second surface of the core panel, are removed for planarizing two ends of the stuffing pillar to be level with the first surface and the second surface of the core panel respectively.

The present invention provides an embedded circuit structure including a core panel, a first circuit pattern, a second circuit pattern, a conductive channel and a plurality of electroplating seed layers. The core panel has a first surface and a second surface opposite to the first surface. The first circuit pattern is embedded into the first surface of the core panel. The second circuit pattern is embedded into the second surface of the core panel. The conductive channel penetrates the core panel, and two ends of the conductive channel are connected with the first circuit pattern and the second circuit pattern respectively. The electroplating seed layers are respectively disposed between the core panel and the first circuit pattern, between the core panel and the second circuit pattern, and between the core panel and the conductive channel.

In one embodiment of the present invention, the embedded circuit structure may further include a stuffing pillar filled into a tubular space of the conductive channel.

The present invention further provides a fabricating process for an embedded circuit structure. A core panel having a first surface and a second surface opposite to the first surface is provided. At least one through hole is formed in the core panel and penetrates the core panel. A conductive material is electroplated into the through hole, so as to form a conductive channel in the through hole, wherein the conductive channel has a tubular space. A stuffing material is filled into the tubular space of the conductive channel for forming a stuffing pillar. Portions of the stuffing pillar, which protrude from the first surface and the second surface of the core panel, are removed for planarizing two ends of the stuffing pillar to be level with the first surface and the second surface of the core panel respectively. A first indent pattern is formed on the first surface of the core panel. A second indent pattern is formed on the second surface of the core panel. The conductive material is electroplated into the first indent pattern and the second indent pattern, so as to form a first circuit pattern in the first indent pattern, and a second circuit pattern in the second indent pattern, wherein portions of the first circuit pattern exceed the first indent pattern, portions of the second circuit pattern exceed the second circuit pattern, and the electroplating process includes performing a chemical electroplating at first and then performing an electrolysis electroplating process. The portions of the first circuit pattern, which exceed the first indent pattern, are removed for planarizing the first circuit pattern to be level with the first surface of the core panel; the portions of the second circuit pattern, which exceed the second indent pattern, are removed for planarizing the second circuit pattern to be level with the second surface of the core panel.

In one embodiment of the present invention, the step of forming the through hole may include a mechanical processing or a laser processing.

In one embodiment of the present invention, the step of forming the first indent pattern and the second indent pattern may include a laser processing.

In one embodiment of the present invention, the step of removing the portions of the first circuit pattern and the portions of the second circuit pattern may include etching or polishing.

The present invention further provides an embedded circuit structure including a core panel, a first circuit pattern, a second circuit pattern, a conductive channel, a first electroplating seed layer, a plurality of second electroplating seed layers, and a stuffing pillar. The core panel has a first surface and a second surface opposite to the first surface. The first circuit pattern is embedded into the first surface of the core panel. The second circuit pattern is embedded into the second surface of the core panel. The conductive channel penetrates the core panel and two ends of the conductive channel are connected with the first circuit pattern and the second circuit pattern respectively. The first electroplating seed layer is disposed between the core panel and the conductive channel. The second electroplating seed layers are respectively disposed between the core panel and the first circuit pattern, and between the core panel and the second circuit pattern. The stuffing pillar is filled into a tubular space of the conductive channel.

In one embodiment of the present invention, the first electroplating seed layer may be disposed between the second electroplating seed layers and the conductive channel.

In the present invention, because the indent patterns disposed at the two surfaces of the core panel can determine the locations of the circuit patterns directly, the alignment accuracy between the circuit patterns can increase relatively.

In order to make the aforementioned and other features, and advantages of the present invention be more comprehensible, embodiments accompanied with figures are described in detail below.

DESCRIPTION OF EMBODIMENTS

FIGS. 1A-1D illustrate a fabricating process for an embedded circuit structure according to one embodiment of the present invention.

Figure 1A:
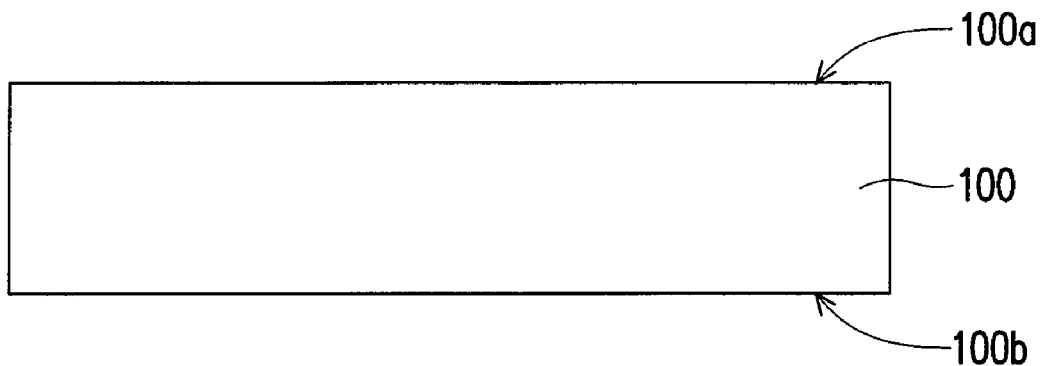
FIGS. 1A-1D illustrate a fabricating process for an embedded circuit structure according to one embodiment of the present invention.

Referring to FIG. 1A, a core panel 100 is provided. In the present embodiment, the core panel 100 is a dielectric panel.

Figure 1B:
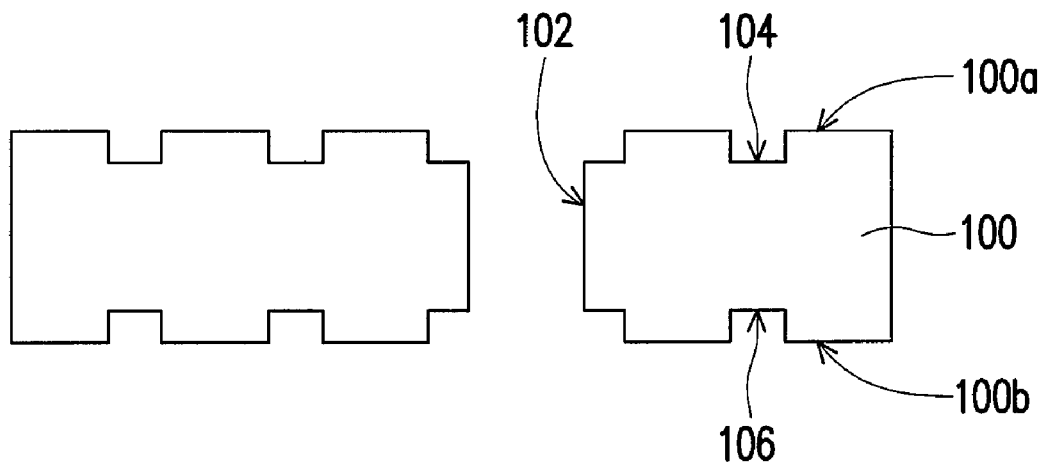

Referring to FIG. 1B, at least one through hole 102 is formed in the core panel 100 and penetrates the core panel 100, wherein the step of forming the through hole 102 can include a mechanical processing or a laser processing. Moreover, a first indent pattern 104 is formed on a first surface 100a of the core panel 100, wherein the step of forming the first indent pattern 104 can include the laser processing. In addition, a second indent pattern 106 is formed on a second surface 100b of the core panel 100, wherein the step of forming the second indent pattern 106 can include the laser processing, and the second surface 100b is opposite to the first surface 100a.

Figure 1C:
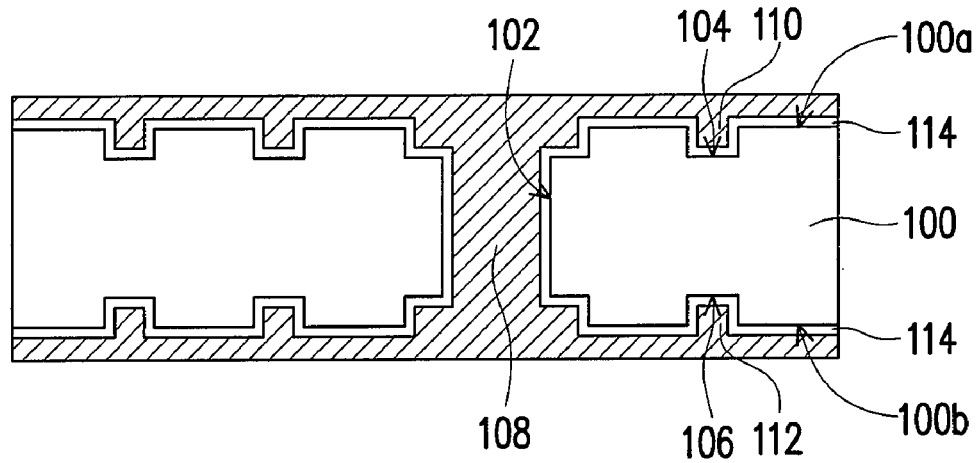

Referring to FIG. 1C, a conductive material is electroplated into the through hole 102, the first indent pattern 104 and the second indent pattern 106, so as to form a conductive channel 108 in the through hole 102, to form a first circuit pattern 110 in the first indent pattern 104, and to form a second circuit pattern 112 in the second indent pattern 106, wherein portions of the first circuit pattern 110 exceed the first indent pattern 104, and portions of the second circuit pattern 112 exceed the second indent pattern 106.

In the present embodiment, the solid conductive channel 108 is formed by completely filling the through hole 102 with the conductive material. Thus, the conductive channel 108 penetrates the core panel 100, and two ends of the conductive channel 108 are connected with the first circuit pattern 110 and the second circuit pattern 112 respectively. Furthermore, the first circuit pattern 110 is embedded into the first surface 100a of the core panel 100, and the second circuit pattern 112 is embedded into the second surface 100b of the core panel 100.

In the present embodiment, the electroplating process includes that a chemical electroplating process is performed at first for forming an electroplating seed layer 114 and then an electrolysis process is performed for forming the conductive channel 108, the first circuit pattern 110 and the second circuit pattern 112. In addition, the first circuit pattern 110 is embedded into the first surface 100a of the core panel 100, and the second circuit pattern 112 is embedded into the second surface 100b of the core panel 100.

Figure 1D:
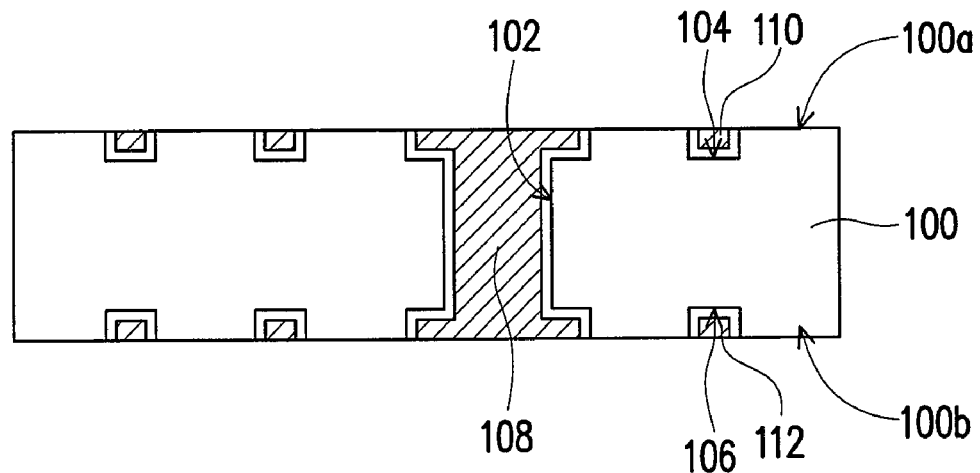

Referring to FIG. 1D, the portions of the first circuit pattern 110, which exceed the first indent pattern 104, are removed for planarizing the first circuit pattern 110 to be level with the first surface 100a of the core panel 100; the portions of the second circuit pattern 112, which exceed the second indent pattern 106, are removed for planarizing the second circuit pattern 112 to be level with the second surface 100b of the core panel 100. In the present embodiment, the step of partially removing the first circuit pattern 110 and the second circuit pattern 112 includes etching or polishing.

FIGS. 2A-2E illustrate a fabricating process for an embedded circuit structure according to another embodiment of the present invention.

Figure 2A:
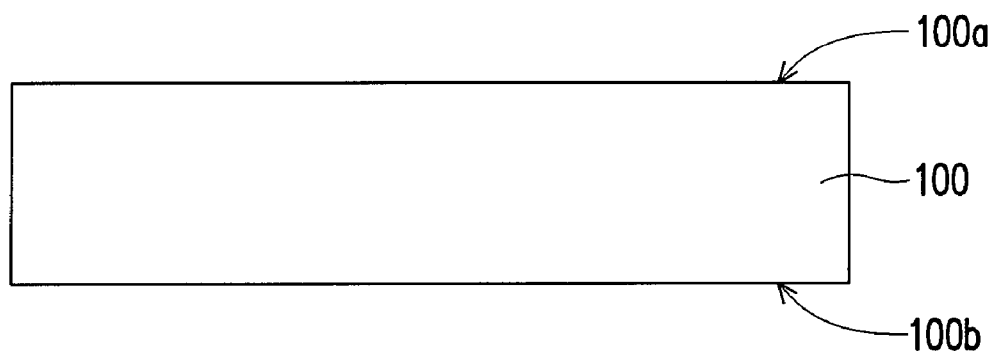
FIGS. 2A-2E illustrate a fabricating process for an embedded circuit structure according to another embodiment of the present invention.

Referring to FIG. 2A, a core panel 100 is provided. In the present embodiment, the core panel 100 is a dielectric panel.

Figure 2B:
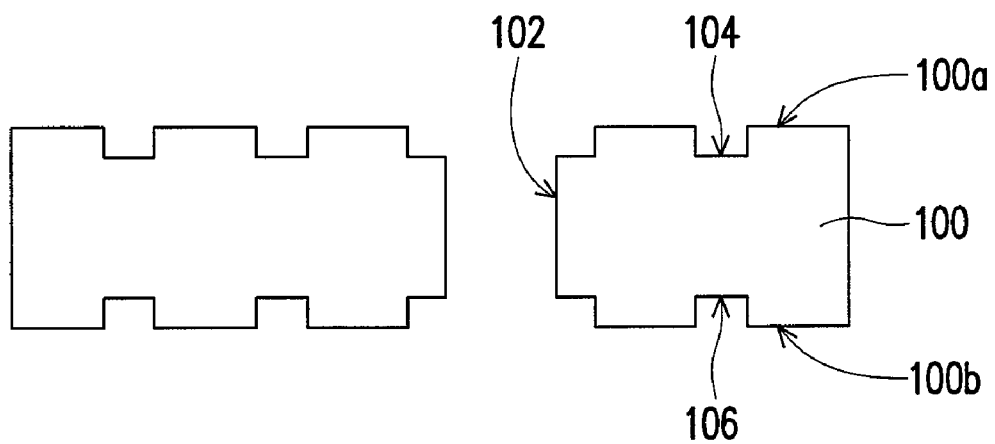

Referring to FIG. 2B, at least one through hole 102 is formed in the core panel 100 and penetrates the core panel 100, wherein the step of forming the through hole 102 can include a mechanical processing or a laser processing. Moreover, a first indent pattern 104 is formed on a first surface 100a of the core panel 100, wherein the step of forming the first indent pattern 104 can include the laser processing. In addition, a second indent pattern 106 is formed on a second surface 100b of the core panel 100, wherein the step of forming the second indent pattern 106 can include the laser processing, and the second surface 100b is opposite to the first surface 100a.

Figure 2C:
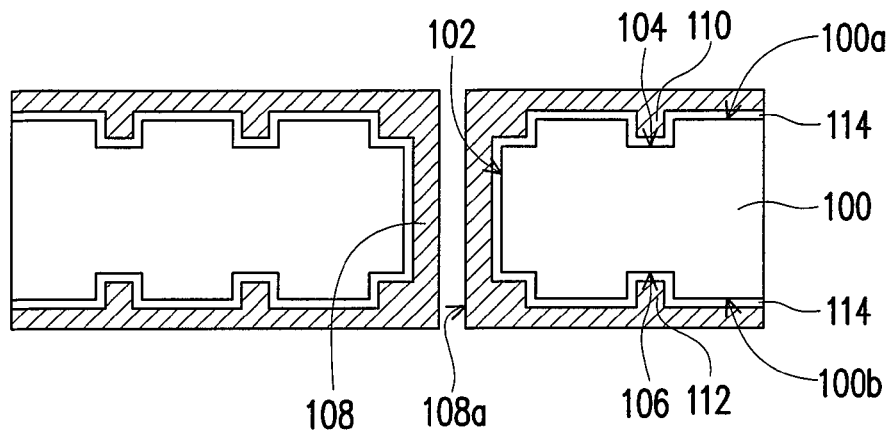

Referring to FIG. 2C, a conductive material is electroplated into the through hole 102, the first indent pattern 104, and the second indent pattern 106, so as to form a conductive channel 108 in the through hole 102, to form a first circuit pattern 110 in the first indent pattern 104 and to form a second circuit pattern 112 in the second indent pattern 106, wherein portions of the first circuit pattern 110 exceed the first indent pattern 104, and portions of the second circuit pattern 112 exceed the second indent pattern 106. In the present embodiment, the conductive material does not fill the through hole 102 to the full, and thereby the conductive channel 108 has a tubular space 108a.

In the present embodiment, the electroplating process includes that a chemical electroplating process is performed at first for forming an electroplating seed layer 114; then, an electrolysis process is performed for forming the conductive channel 108, the first circuit pattern 110, and the second circuit pattern 112. Thus, the conductive channel 108 penetrates the core panel 100, and two ends of the conductive channel 108 are connected with the first circuit pattern 110 and the second circuit pattern 112 respectively. In addition, the first circuit pattern 110 is embedded into the first surface 100a of the core panel 100, and the second circuit pattern 112 is embedded into the second surface 100b of the core panel 100.

Figure 2D:
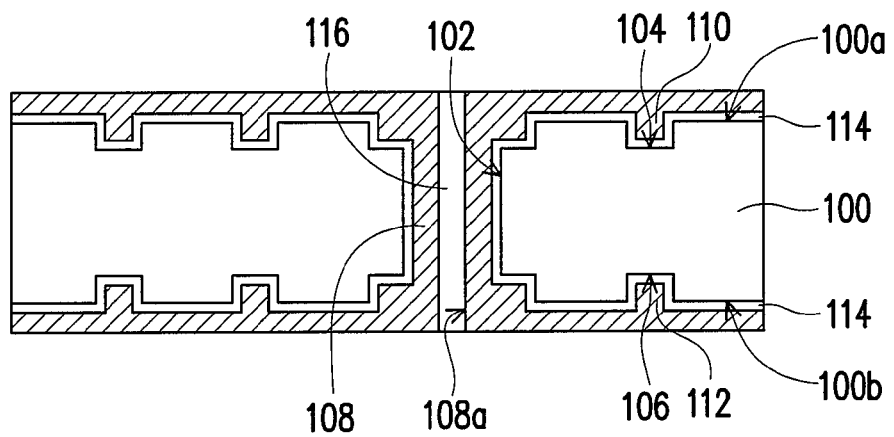

Referring to FIG. 2D, a stuffing material is filled into the tubular space 108a of the conductive channel 108 for forming a stuffing pillar 116.

Figure 2E:
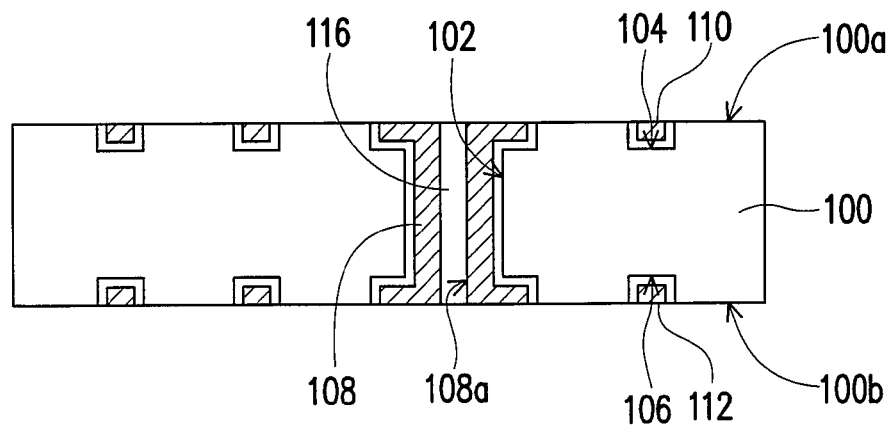

Referring to FIG. 2E, the portions of the first circuit pattern 110, which exceed the first indent pattern 104, are removed for planarizing the first circuit pattern 110 to be level with the first surface 100a of the core panel 100; the portions of the second circuit pattern 112, which exceed the second indent pattern 106, are removed for planarizing the second circuit pattern 112 to be level with the second surface 100b of the core panel 100. In the present embodiment, the step of partially removing the first circuit pattern 110 and the second circuit pattern 112 can include etching or polishing. In the present embodiment, the fabricating process further includes that portions of stuffing pillar 116, which protrude from the first surface 100a and the second surface 100b respectively, are removed for planarizing two ends of the stuffing pillar 116 to be level with the first surface 100a and the second surface 100b of the core panel 100 respectively.

FIGS. 3A-3G illustrate a fabricating process for an embedded circuit structure according to still another embodiment of the present invention.

Figure 3A:
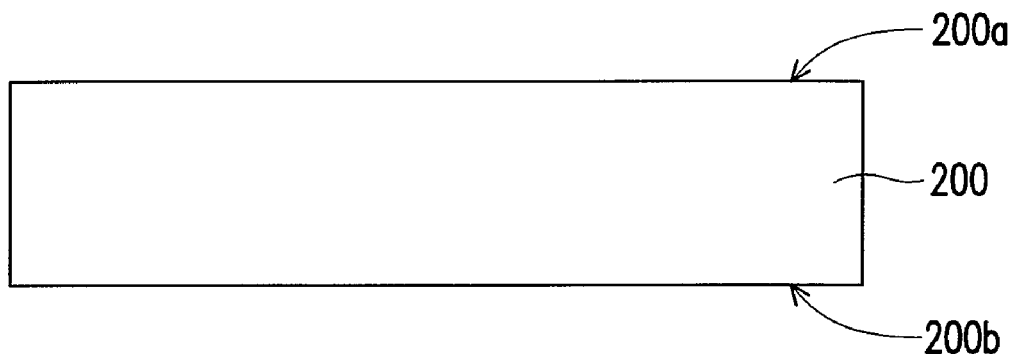
FIGS. 3A-3H illustrate a fabricating process for an embedded circuit structure according to still another embodiment of the present invention.

Referring to FIG. 3A, a core panel 200 is provided. In the present embodiment, the core panel 200 is a dielectric panel.

Figure 3B:
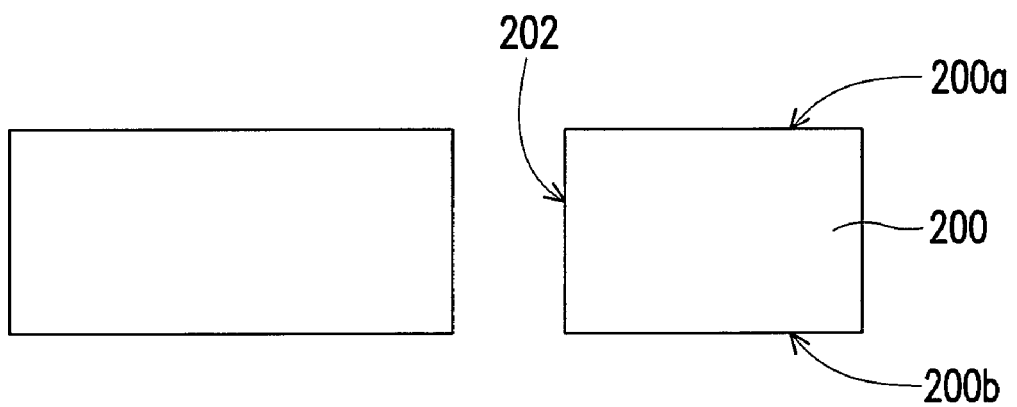

Referring to FIG. 3B, at least one through hole 202 is formed in the core panel 200 and penetrates the core panel 200, wherein the step of forming the through hole 202 can include a mechanical processing or a laser processing.

Figure 3C:
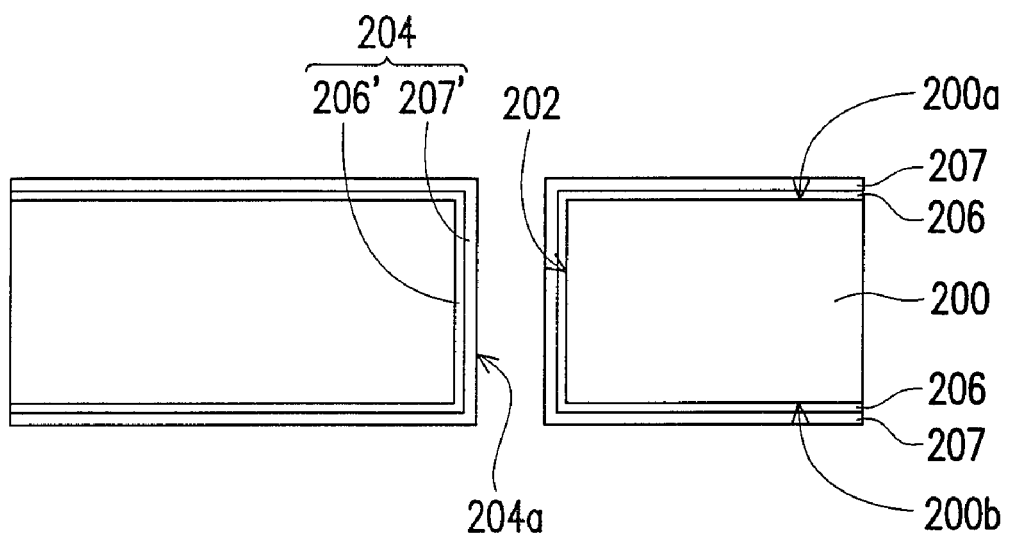

Referring to FIG. 3C, a conductive material is electroplated into the through hole 202, so as to form a conductive channel 204 in the through hole 202, wherein the conductive channel 204 has a tubular space 204a. In the present embodiment, because the conductive channel 204 is formed by performing the electroplating process, a first electroplating seed layer 206 is formed between the inner wall of the through hole 202 and the outer surface of the conductive channel 204, while an electroplating layer 207 is formed on the first electroplating seed layer 206. Thus, conductive channel 204 is formed of a portion 206' of the first electroplating seed layer 206 in the through hole 202 and a portion 207' of the electroplating layer 207 in the through hole 202.

Figure 3D:
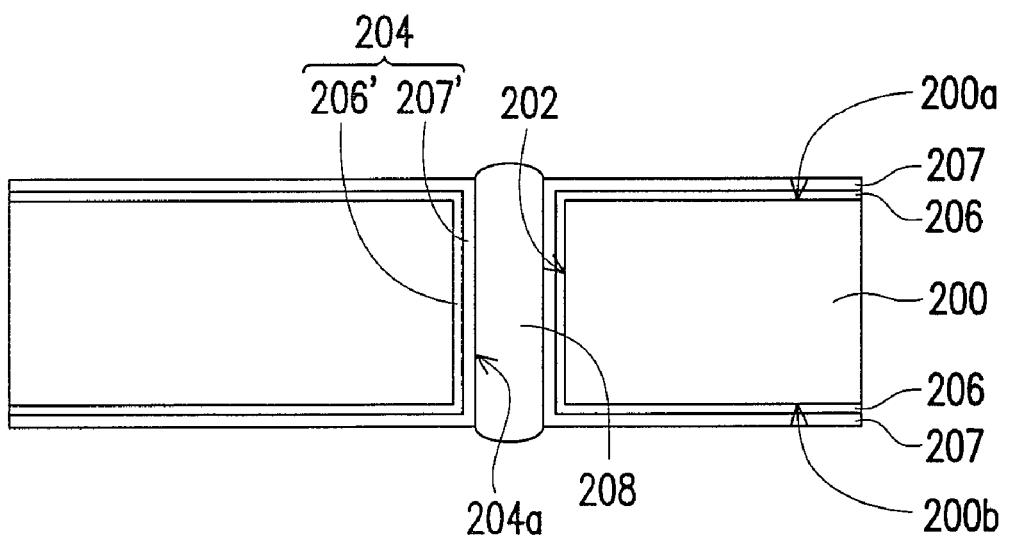

Referring to FIG. 3D, a stuffing material is filled into the tubular space 204a of the conductive channel 204 for forming a stuffing pillar 208.

Figure 3E:
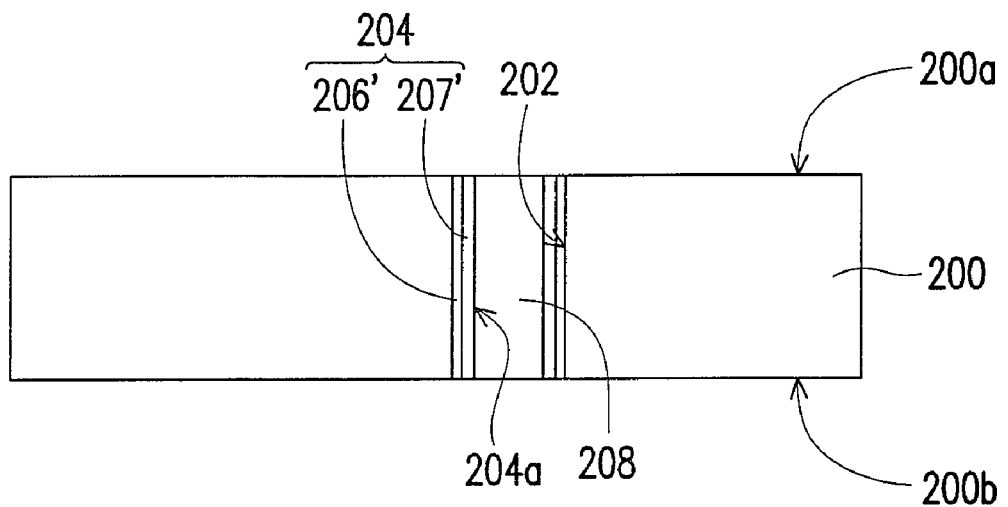

Referring to FIG. 3E, portions of the stuffing pillar 208, which protrude from a first surface 200a and a second surface 200b of the core panel 200, are removed for planarizing two ends of the stuffing pillar 208 to be level with the first surface 200a and the second surface 200b of the core panel 200. In the present embodiment, portions of the first electroplating seed layer 206 on the first surface 200a and portions of the electroplating layer 207 on the second surface 200b are further removed.

Figure 3F:
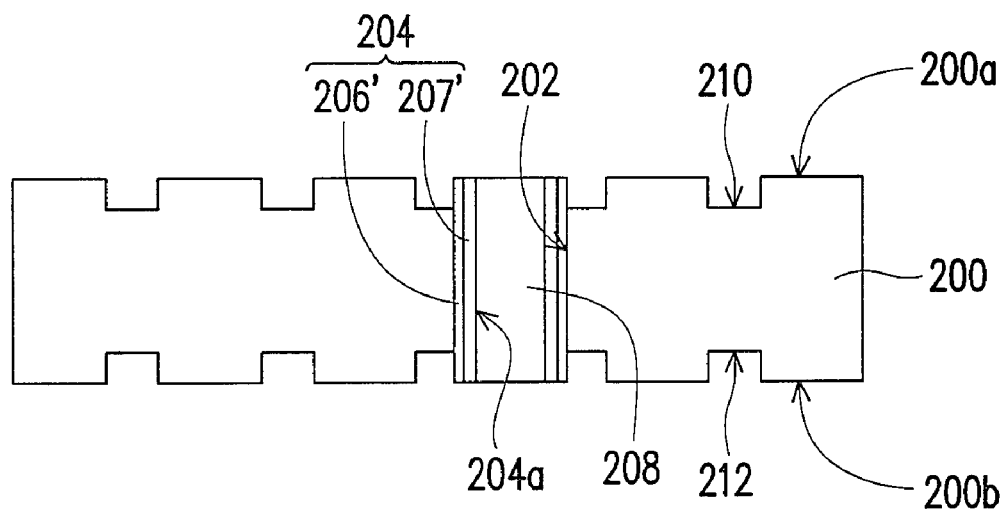

Referring to FIG. 3F, a first indent pattern 210 is formed on the first surface 200a of the core panel 200, wherein the step of forming the first indent pattern 210 can include the laser processing. Moreover, a second indent pattern 212 is formed on the second surface 200b of the core panel 200, wherein the step of forming the second indent pattern 212 can include the laser processing.

Figure 3G:
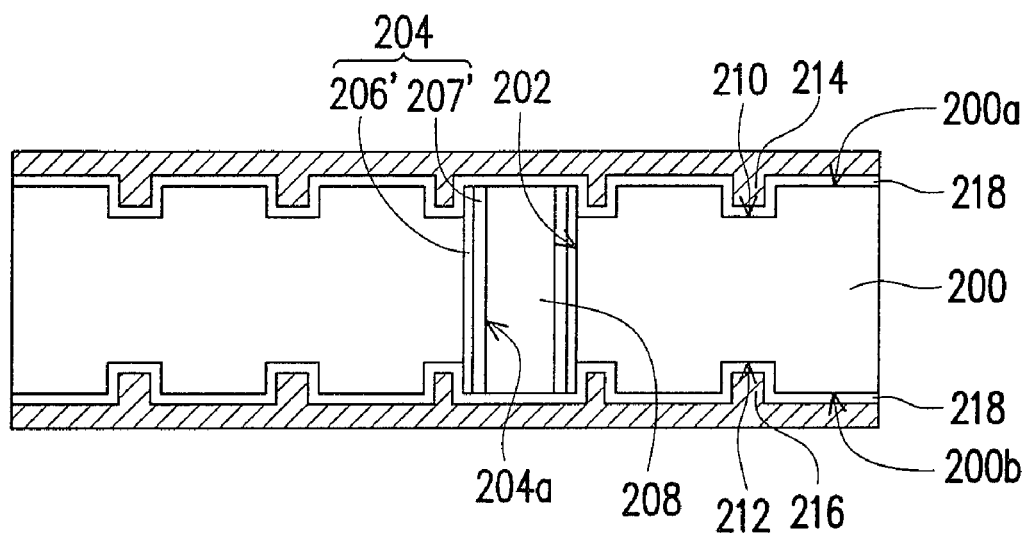

Referring to FIG. 3G, a conductive material is electroplated to the first indent pattern 210 and the second indent pattern 212, so as to form a first circuit pattern 214 in the first indent pattern 210 and to form a second circuit pattern 216 in the second indent pattern 212, wherein portions of the first circuit pattern 214 exceeds the first indent pattern 210, and portions of the second circuit pattern 216 exceed the second indent pattern 212.

In the present embodiment, the electroplating process includes that the conductive material is electroplated by performing a chemical electroplating process at first for forming two second electroplating seed layers 218 on the first surface 200a and the second surface 200b of the core panel 200 respectively; then, the conductive material is electroplated by performing an electrolysis electroplating process for forming the first circuit pattern 214 and the second circuit pattern 216 on the second electroplating seed layers 218. Thus, the first circuit pattern 214 is embedded into the first surface 200a of the core panel 200. The second circuit pattern 216 is embedded into the second surface 200b of the core panel 200. Two ends of the conductive channel 204 are connected with the first circuit pattern 214 and the second circuit pattern 216 respectively.

Figure 3H:
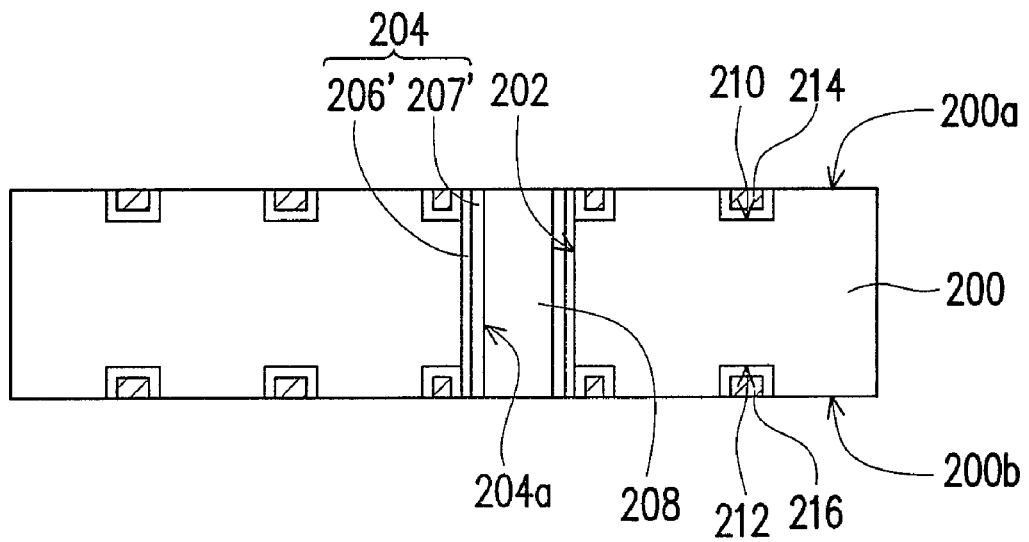

Referring to FIG. 3H, the portions of the first circuit pattern 214, which exceed the first indent pattern 210, are removed for planarizing the first circuit pattern 214 to be level with the first surface 200a of the core panel 200; the portions of the second circuit pattern 216, which exceed the second indent pattern 212, are removed for planarizing the second circuit pattern 214 to be level with the second surface 100b of the core panel 200.

In the present embodiment, portions of one of the second electroplating seed layers 218, which exceed the first indent pattern 210 are also removed for planarizing the second electroplating seed layer 218 on the first surface 200a to be level with the first surface 200a of the core panel 200; portions of the other second electroplating seed layer 218, which exceed the second indent pattern 212, are also removed for planarizing the second electroplating seed layer 218 on the second surface 200b to be level with the second surface 200b of the core panel 200.

In the present embodiment, the step of removing the portions of the first circuit pattern 214 and the portions of the second circuit pattern 216 can include etching or polishing. Similarly, the step of removing the portions of the second electroplating seed layers 218 can also include etching or polishing.

According to the invention disclosed by U.S. Pat. No. 5,504,992, a thin metallic layer which serves as an electroplating seed layer will be removed and does not remain between a circuit pattern and a dielectric layer after the fabricating process is completed. However, compared with the U.S. Pat. No. 5,504,992, in the present invention, portions of the electroplating seed layers fabricated in the fabricating process remain between the two circuit patterns and the core panel after the fabricating process is completed.

In summary, according to the present invention, the conductive material is filled into the two indent patterns by performing the electroplating process for forming the circuit patterns embedded into the core panel after the two indent patterns are respectively formed on the two surfaces of the core panel, and thereby the embedded circuit structure which can serve as a circuit board or portions of the circuit board is fabricated. Moreover, at least one conductive channel, which connects the circuit patterns disposed in different levels, can be fabricated before fabricating the circuit patterns or can be fabricated when fabricating the circuit patterns.

It should be noted because the indent patterns disposed at the two surfaces of the core panel can directly determine the locations of the circuit patterns, the alignment accuracy between the circuit patterns can increase relatively.

It will be apparent to those skilled in the art that various modifications and variations can be made to the present invention without departing from the scope or spirit of the invention. In view of the foregoing, it is intended that the present invention cover modifications and variations of this invention provided they fall within the scope of the following claims and their equivalents.

What is claimed is:

1. An embedded circuit structure, comprising:
a core panel having a first surface and a second surface opposite to the first surface;
a first circuit pattern embedded into the first surface of the core panel;
a second circuit pattern embedded into the second surface of the core panel;
a conductive channel penetrating the core panel, two ends of the conductive channel connecting the first circuit pattern and the second circuit pattern respectively;
a first electroplating seed layer disposed between the core panel and the conductive channel;
a plurality of second electroplating seed layers respectively disposed between the core panel and the first circuit pattern, and between the core panel and the second circuit pattern; and
a stuffing pillar filled into a tubular space of the conductive channel,
wherein the first electroplating seed layer and the second electroplating seed layers are physically independent of each other, the first electroplating seed layer is disposed between the second electroplating seed layers and the conductive channel, and the second electroplating seed layers contact portions of the first seed layer outside the ends of the conductive channel respectively.

* * * * *